(12) United States Patent
Jiang

(10) Patent No.: US 12,133,325 B2
(45) Date of Patent: Oct. 29, 2024

(54) DISPLAY DEVICE AND ELECTRONIC APPARATUS

(71) Applicants: Wuhan China Star Optoelectronics Technology Co., Ltd., Hubei (CN); Wuhan China Star Optoelectronics Semiconductor Display Technology Co., Ltd., Hubei (CN)

(72) Inventor: Congcong Jiang, Hubei (CN)

(73) Assignees: Wuhan China Star Optoelectronics Technology Co., Ltd., Wuhan (CN); Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 17/432,945

(22) PCT Filed: Jun. 15, 2021

(86) PCT No.: PCT/CN2021/100091
§ 371 (c)(1),
(2) Date: Aug. 23, 2021

(87) PCT Pub. No.: WO2022/241882
PCT Pub. Date: Nov. 24, 2022

(65) Prior Publication Data
US 2024/0130039 A1    Apr. 18, 2024

(30) Foreign Application Priority Data
May 20, 2021 (CN) .......................... 202110553281.3

(51) Int. Cl.
*H05K 1/02* (2006.01)

(52) U.S. Cl.
CPC ... *H05K 1/028* (2013.01); *H05K 2201/10128* (2013.01)

(58) Field of Classification Search
CPC .................... H05K 1/028; H05K 2201/10128
USPC ......................................................... 361/749
See application file for complete search history.

(56) References Cited

U.S. PATENT DOCUMENTS

| 2016/0219723 A1 | 7/2016 | Jung et al. |
| 2017/0202096 A1 | 7/2017 | Park et al. |
| 2019/0181363 A1 | 6/2019 | Lee et al. |

(Continued)

FOREIGN PATENT DOCUMENTS

| CN | 108305564 | 7/2018 |
| CN | 108877528 | 11/2018 |
| CN | 109272871 | 1/2019 |

(Continued)

*Primary Examiner* — Binh B Tran

(57) ABSTRACT

The present application provides a display device and an electronic apparatus. The display device includes a panel, a flexible connecting member, a printed circuit board, a cover plate, and a bracket. The flexible connecting member connects the panel and the printed circuit board. The cover plate comprises a flat region and a curved region. An inner surface of the cover plate is attached to a first surface of the panel. The bracket comprises a planar portion. The planar portion horizontally supports the printed circuit board. Accordingly, the present application improves accuracy of a sucking head for sucking the printed circuit board during a bonding process of the printed circuit board.

18 Claims, 2 Drawing Sheets

(56) References Cited

U.S. PATENT DOCUMENTS

2020/0381661 A1* 12/2020 Lee ................. H10K 50/844
2021/0382570 A1* 12/2021 Jeon ................. G06F 3/04886

FOREIGN PATENT DOCUMENTS

| CN | 109524433 | 3/2019 |
| CN | 110491926 | 11/2019 |
| CN | 110753669 | 2/2020 |
| CN | 110861290 | 3/2020 |
| CN | 111326071 | 3/2020 |
| CN | 111128020 | 5/2020 |
| CN | 111667773 | 9/2020 |
| CN | 112265281 | 1/2021 |
| CN | 212424638 | 1/2021 |
| CN | 112365806 | 2/2021 |
| CN | 112622291 | 4/2021 |

* cited by examiner

DISPLAY DEVICE AND ELECTRONIC APPARATUS

RELATED APPLICATIONS

This application is a National Phase of PCT Patent Application No. PCT/CN2021/100091 having International filing date of Jun. 15, 2021, which claims the benefit of priority of Chinese Patent Application No. 202110553281.3 filed on May 20, 2021. The contents of the above applications are all incorporated by reference as if fully set forth herein in their entirety.

FIELD AND BACKGROUND OF THE INVENTION

The present application relates to a display field and in particular, to a display device and an electronic apparatus.

With an increasing demand for full screens, curved four-sided display screens have developed rapidly. However, as shown in FIG. 1, for a curved display screen, because of a curved surface of a cover plate (i.e., a cover glass, or CG for short), the flexible printed circuit board (FPC) tilts out along the curved surface of the cover plate when the cover plate and the display panel are pressed together. This affects accuracy of a sucking head for sucking the printed circuit board during a subsequent bonding process of the flexible printed circuit board.

SUMMARY OF THE INVENTION

The present application provides a display device and an electronic apparatus, which improves accuracy of a sucking head for sucking a printed circuit board during a bonding process.

The present application provides a display device, comprising:
  a panel, a flexible connecting member, a printed circuit board, a cover plate, and a bracket;
  wherein the flexible connecting member connects the panel and the printed circuit board; the cover plate comprises a flat region and a curved region; an inner surface of the cover plate is attached to a first surface of the panel; the bracket comprises a planar portion; and the planar portion is horizontally attached to the printed circuit board.

Optionally, in some embodiments of the present application, a length of the planar portion is less than a length of the printed circuit board.

Optionally, in some embodiments of the present application, an orthographic projection of the planar portion projected on a plane where the printed circuit board is located falls within an area where the printed circuit board is located.

Optionally, in some embodiments of the present application, the bracket further comprises an arc-shaped portion, the arc-shaped portion is connected to a side of the planar portion close to the flexible connecting member, and a concave surface of the arc-shaped portion is away from the flexible connecting member.

Optionally, in some embodiments of the present application, before the printed circuit board is bonded to a second surface of the panel, the arc-shaped portion and the curved region contact and support each other, and the curved region accommodates a portion of the flexible connecting member, and the arc-shaped portion supports other portions of the flexible connecting member.

Optionally, in some embodiments of the present application, after the printed circuit board is bonded to a second surface of the panel, the curved region accommodates a portion of the flexible connecting member, a convex surface of the arc-shaped portion presses the flexible connecting member, and the planar portion presses the printed circuit board.

Optionally, in some embodiments of the present application, a boundary face between the planar portion and the arc-shaped portion is flush with a boundary face between the printed circuit board and the flexible connecting member.

Optionally, in some embodiments of the present application, a width of the arc-shaped portion is arranged corresponding to a width of the flexible connecting member, and the width of the arc-shaped portion is greater than or equal to the width of the flexible connecting member.

Optionally, in some embodiments of the present application, an arc measure of the arc-shaped portion is greater than 0 degrees and less than or equal to 90 degrees.

Accordingly, the present application provides an electronic apparatus comprising the display device of any embodiment of the present application.

Advantages of the Present Application

The present application provides a display device and an electronic apparatus. The display device comprises a panel, a flexible connecting member, a printed circuit board, a cover plate, and a bracket. The flexible connecting member connects the panel and the printed circuit board. The cover plate comprises a flat region and a curved region. An inner surface of the cover plate is attached to a first surface of the panel. The bracket comprises a planar portion. The planar portion is horizontally attached to the printed circuit board. The display device of the present application provides a bracket with a planar portion. Before the printed circuit board is bonded to a second surface of the panel, the planar portion of the bracket is horizontally attached to and supports the printed circuit board, which improves accuracy of a sucking head for sucking the printed circuit board during a bonding process of the printed circuit board.

BRIEF DESCRIPTION OF THE SEVERAL VIEWS OF THE DRAWINGS

In order to more clearly illustrate the technical solutions of the present application, figures which will be described in the embodiments are briefly introduced hereinafter. It is obvious that the figures are merely for the purposes of illustrating some embodiments of the present application, and a person having ordinary skill in this field can obtain other figures according to these figures without an inventive work.

DESCRIPTION OF SPECIFIC EMBODIMENTS OF THE INVENTION

Figure 1:
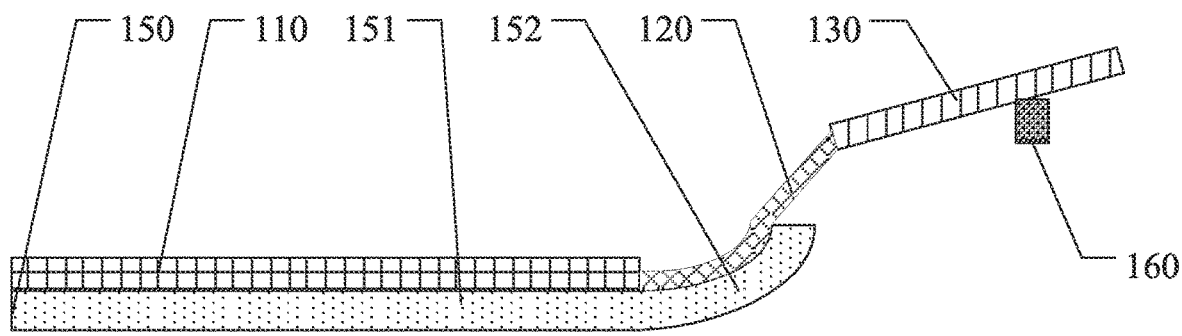
FIG. 1 is a schematic structural view illustrating a conventional display device.

The technical solutions in the embodiments of the present application will be clearly and completely described below in conjunction with the accompanying drawings of the present application. Obviously, the described embodiments are only some embodiments of the present application, rather than all embodiments of the present application. All other embodiments obtained by those skilled in the art without creative work shall fall within the protection scope of the present application. In addition, it should be understood that the specific embodiments described here are only used to illustrate and explain the present application, and are not used to limit the present application. In the present application, unless otherwise specified, the directional terms such as "up" and "down" generally refer to up and down directions of a device in actual use or working state, and specifically refer to directions in the drawings while "inner" and "outer" are referred to in relation to an outline of the device.

The present application provides a display device and an electronic apparatus to reduce damage of a printed circuit board or a flexible connecting member during a transportation process, and improve accuracy of a sucking head for sucking the printed circuit board during a bonding process of the printed circuit board. Detailed descriptions are provided below. It should be noted that an order of descriptions in the following embodiments is not intended to limit an order of preference on the embodiments.

Figure 2:
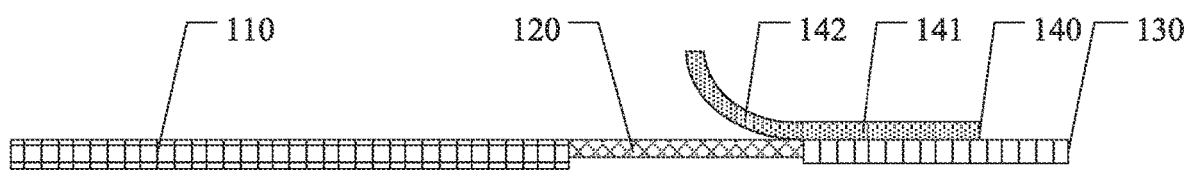
FIG. 2 is a first schematic structural view illustrating a display device according to one embodiment of the present application.
Figure 3:
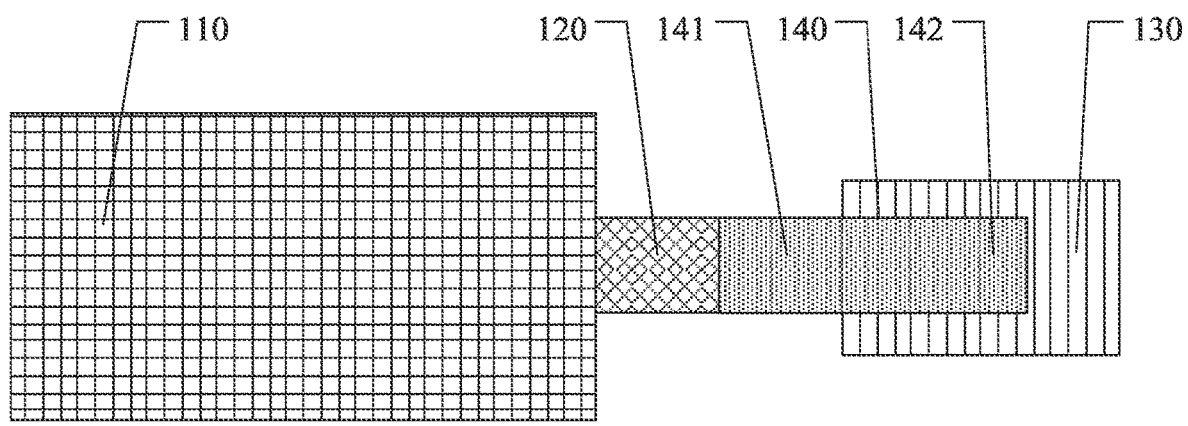
FIG. 3 is a second schematic structural view illustrating the display device according to one embodiment of the present application.

In one embodiment, please refer to FIGS. 2 and 3. FIG. 2 shows a first schematic structural view of a display device according to the present application, and specifically shows a schematic structural view illustrating the display device before 3D bonding is performed. FIG. 3 shows a second schematic structural view of the display device according to one embodiment of the present application, and specifically shows a schematic top view of the display device of FIG. 2. As shown in FIGS. 2 and 3, the display device 10 of the present application comprises a panel 110, a flexible connecting member 120, a printed circuit board 130, and a bracket 140. The flexible connecting member 120 connects the panel 110 and the printed circuit board 130, and the flexible connecting member 120 comprises wires for electrically connecting the panel 110 and the printed circuit board 130. The bracket 140 comprises a planar portion 141 and an arc-shaped portion 142. A surface of the bracket 140 near a convex surface of the arc-shaped portion 142 is an outer surface of the bracket 140. An outer surface of the planar portion 141 is attached to the printed circuit board 130, the arc-shaped portion 142 is located at one side of the planar portion 141 close to the flexible connecting member 120, and an outer surface of the arc-shaped portion 142 is close to the flexible connecting member 120.

Specifically, the panel 110 comprises a display panel. The display panel can be an organic light emitting diode (OLED) display panel, a liquid crystal display (LCD), or a light emitting diode (LED) display panel, or any other type of display panel, which is not limited here. An upper side of the panel 110 in the drawings is a cover plate package side of the display panel. Furthermore, the panel 110 can also comprise a backplate and a reinforcing plate disposed under the display panel. For a flexible display panel, since the flexible display panel is usually a thin and flexible structure without a rigid support layer, the flexible display panel cannot support itself due to its relatively low hardness and stiffness. Therefore, the backplate needs to be provided on a back of the flexible display panel to provide support for the flexible display panel. The backplate is generally a flexible support layer, and its material can be an inorganic material, such as glass or metal materials (aluminum alloy, stainless steel, etc.), or can be an organic material, such as hard plastic and usually organic support materials which include, but is not limited to, polyurethane rubber, acrylic materials, and epoxy materials. The support plate is disposed on one side of the backplate away from the flexible display panel. That is to say, the support plate is arranged as a lowermost layer of the panel 110 to support the entire panel 110. The support plate is generally a hard metal plate made of a metal material with a greater modulus in order to strengthen a structure of the entire panel 110 and dissipate heat of the display panel. A material of the metal plate comprises metal copper, aluminum alloy, or stainless steel. An adhesive layer is provided between the backplate and the display panel, and between the backplate and the support plate for bonding them together.

The flexible connecting member 120 is arranged between the panel 110 and the printed circuit board 130 and connects the panel 110 and the printed circuit board 130. The flexible connecting member 120 comprises a plurality of connection wires for electrically connecting the panel 110 and the printed circuit board 130. The connection wires are configured to transmit electrical signals of the printed circuit board 130 to a circuit structure of the panel 110. If the connection wires are broken, it hinders signal transmission from the printed circuit board 130 to the panel 110, and therefore affects performance of the entire display device.

The flexible connecting member 120 is generally a flexible connecting member, which can be bent and folded. With flexibility, the printed circuit board 130 is moved to the back of the panel 110, so as to bond the printed circuit board 130 to the panel 110. The commonly used flexible connecting member is often called chip on film (COF).

The printed circuit board 130 is connected to the panel 110 through the flexible connecting member 120, and the printed circuit board is used to transmit electrical signals to the panel 110, thereby driving normal display functions and operations of the panel 110. Preferably, the printed circuit board 130 is a flexible printed circuit board (FPC).

The bracket 140 is used to support the printed circuit board 130 and the flexible connecting member 120. The bracket 140 is an organic rigid bracket, and the organic rigid bracket is preferably a polyethylene glycol terephthalate (PET) bracket. The bracket 140 comprises the planar portion 141 and the arc-shaped portion 142. The planar portion 141 and the arc-shaped portion 142 are integrally formed. The arc-shaped portion 142 is located at one side of the planar portion 141 close to the flexible connecting member 120. The surface of the bracket 140 close to the convex surface of the arc-shaped portion 142 is the outer surface of the bracket 140, and a surface of the bracket 140 close to a concave surface of the arc-shaped portion 142 is an inner surface of the bracket 140. The outer surface of the bracket 140 is close to the printed circuit board 130 and flexible connecting member 120, the inner surface of the bracket 140 is close to the printed circuit board 130 and the flexible connecting member 120, the outer surface of the planar portion 141 is attached to the printed circuit board 130, and the outer surface of the arc-shaped portion 142 is close to the flexible connecting member 120.

In one embodiment, as shown in FIGS. 2 and 3, a horizontal distance of the bracket 140 in FIGS. 2 and 3 is a length of the bracket 140, and a vertical distance is a width of the bracket 140. A horizontal distance of the printed circuit board 130 is a length of the printed circuit board 130, and a vertical distance is a width of the printed circuit board 130. A horizontal distance of the flexible connecting member 120 is a length of the flexible connecting member 120, and a vertical distance is a width of the flexible connecting member 120. A length of the planar portion 141 is less than the length of the printed circuit board 130, so that it is ensured that a right side portion of an area of the printed circuit board 130 is not attached to the planar portion 141, and the reserved area (the right side portion) of the printed circuit board 130 is used to facilitate a sucking head to suck the printed circuit board 130 in a subsequent bonding process.

Furthermore, as shown in FIG. 3, an orthographic projection of the planar portion 141 projected on a plane where the printed circuit board 130 is located falls within an area where the printed circuit board 130 is located.

Furthermore, the orthographic projection of the planar portion 141 on the plane where the printed circuit board 130 is located is mirror-symmetrical with respect to a central axis of a width side of the printed circuit board 130, which ensures that the planar portion 141 can provide uniform support to the printed circuit board 130 and prevents problems such as damage, tilt, or inaccurate suction of the printed circuit board 130 due to uneven support of the planar portion 141 to the printed circuit board 130 in a subsequent manufacturing process.

Furthermore, as shown in FIGS. 2 and 3, a boundary face between the planar portion 141 and the arc-shaped portion 142 is flush with a boundary face between the printed circuit board 130 and the flexible connecting member 120. In the subsequent manufacturing process, the planar portion 141 supports the printed circuit board 130, and the arc-shaped portion 142 supports the flexible connecting member 120. Such a one-to-one correspondence support manner makes each of the printed circuit board 130 and the flexible connecting member 120 receive a uniform support force, thus preventing a problem of local uneven support to the printed circuit board 130 or the flexible connecting member 120, resulting from presence of the boundary face between the planar portion 141 and the arc-shaped portion 142.

In one embodiment, a width of the arc-shaped portion 142 is less than or equal to a width of the planar portion 141. In general, the width of the flexible connecting member 120 is less than the width of the printed circuit board 130, so the width of the arc-shaped portion 142 which correspondingly supports the flexible connecting member 120 is less than or equal to the width of the planar portion 141 which correspondingly supports the printed circuit board 130.

In one embodiment, a length of the arc-shaped portion 142 is less than the length of the flexible connecting member 120. Since a portion of the arc-shaped portion 142 is accommodated in the curved region of the cover plate 150 in the subsequent manufacturing process, the length of the arc-shaped portion 142 needs to be less than the length of the flexible connecting member 120, so as to ensure a support function of the arc-shaped portion 142 on a partial area of the flexible connecting member 120. As shown in FIG. 3, the width of the arc-shaped portion 142 is equal to the width of the flexible connecting member 120, and the width of the arc-shaped portion 142 is arranged corresponding to the width of the flexible connecting member 120. This way, the present application ensures that the arc-shaped portion 142 supports the flexible connecting member 120 uniformly, and also saves manufacturing costs of the bracket 140.

In one embodiment, an arc measure of the arc-shaped portion 142 is greater than 0 degrees and less than or equal to 90 degrees.

Figure 4:
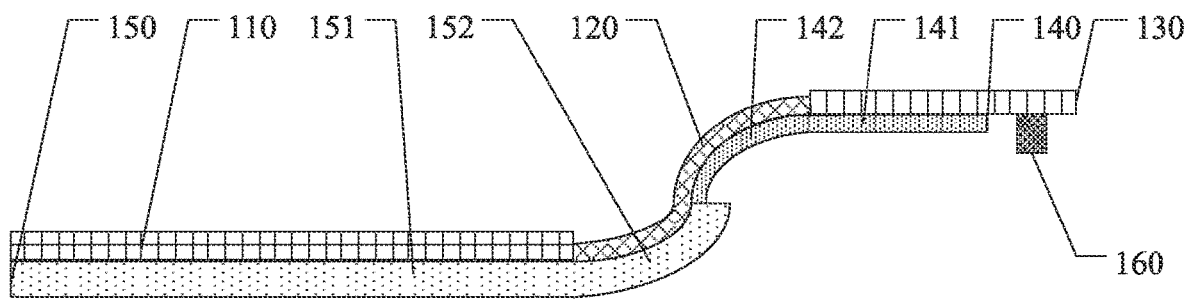
FIG. 4 is a third schematic structural view illustrating the display device according to one embodiment of the present application.

In one embodiment, please refer to FIG. 4. FIG. 4 shows a second schematic structural view of the display device according to one embodiment of the present application. Specifically, FIG. 4 shows a structure of the display device before bonded to the printed circuit board and after 3D bonding. As shown in FIG. 4, the display device 10 provided by the present application comprises a panel 110, a flexible connecting member 120, a printed circuit board 130, a bracket 140, and a cover plate 150. The flexible connecting member 120 connects the panel 110 and the printed circuit board 130. The flexible connecting member 120 comprises wires for electrically connecting the panel 110 and the printed circuit board 130. The cover plate 150 comprises a flat region 151 and a curved region 152. A surface of the cover plate 150 close to a concave surface of the curved region 152 is an inner surface of the cover plate 150. The inner surface of the cover plate 150 is attached to the panel 110, and the curved region 152 accommodates a portion of the flexible connecting member 120.

The bracket 140 comprises a planar portion 141 and an arc-shaped portion 142. An outer surface of the planar portion 141 is attached to the printed circuit board 130. The outer surface of the arc-shaped portion 142 supports other portions of the flexible connecting member 120. The arc-shaped portion 142 and the curved region 152 contact and support each other.

Specifically, in the 3D bonding performed on the display device in the previous embodiment, the display device is packaged using the curved cover plate 150, and a cover plate package side of the display panel is 3D bonded to the cover plate 150 to obtain the display device after the 3D bonding. The display device is the display device in the embodiment shown in FIG. 4. It can be known from the display device shown in FIG. 4 that after the 3D bonding, the bracket 140 is relatively supported by and fixed to the cover plate 150, thereby supporting the printed circuit board 130 and the flexible connecting member 120, thus maintaining stability of the display device during a transportation process, and reducing damage of the printed circuit board 130 or the flexible connecting member 120 during the transportation process. At the same time, the planar portion 141 of the bracket 140 horizontally supports the printed circuit board, thus improving accuracy of a sucking head 160 for sucking the printed circuit board 130 during a bonding process, reducing shaking of the printed circuit board 130 during the bonding process, and preventing damage to the wires of the flexible connecting member 120 during the bonding process.

In one embodiment, an inner surface of the curved region 152 and the outer surface of the arc-shaped portion 142 are smoothly connected, which ensures that the flexible connecting member 120 obtains smooth support from a junction between the curved region 152 and the arc-shaped portion 142, and prevents damage of the flexible connecting member 120 resulting from steps (level differences) or protrusions at the junction between the curved region 152 and the arc-shaped portion 142. Furthermore, a radius of an arc of the curved region 152 is equal to a radius of an arc of the arc-shaped portion 142, thus further ensuring a smooth connection between the inner surface of the curved region 152 and the outer surface of the arc-shaped portion 142.

Figure 5:
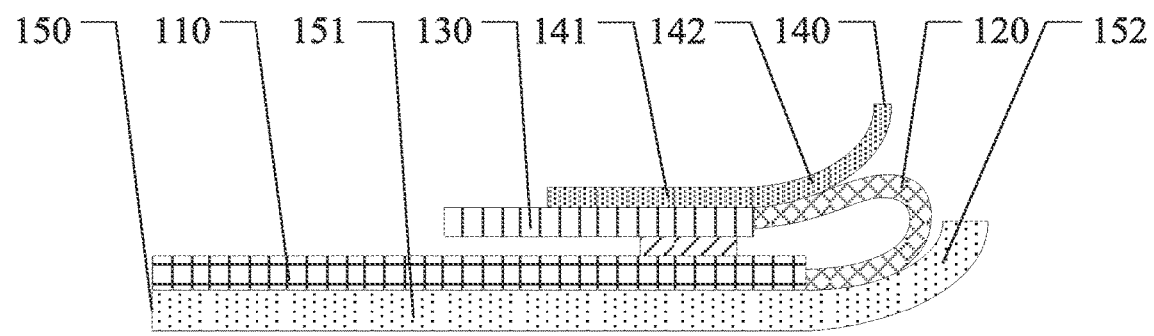
FIG. 5 is a fourth schematic structural view illustrating the display device according to one embodiment of the present application.

In one embodiment, please refer to FIG. 5. FIG. 5 shows a third schematic structural view illustrating the display device according to one embodiment of the present application, and specifically shows a schematic structural view of the display device after the printed circuit board is bonded. As shown in FIG. 5, the display device 10 of the present application comprises a panel 110, a flexible connecting member 120, a printed circuit board 130, a bracket 140, and a cover plate 150. The flexible connecting member 120 connects the panel 110 and the printed circuit board 130. The flexible connecting member 120 comprises wires electrically connected to the panel 110 and the printed circuit board 130. The cover plate 150 comprises a flat region 151 and a curved region 152. An inner surface of the cover plate 150 is attached to a first surface of the panel 110. The printed circuit board 130 is attached to a second surface of the panel 110 by bending the flexible connecting member 120, the curved region 152 accommodates at least a portion of the flexible connecting member 120.

The bracket 140 comprises a planar portion 141 and an arc-shaped portion 142. An outer surface of the planar portion 141 is attached to the printed circuit board 130, and an outer surface of the arc-shaped portion 142 presses the flexible connecting member 120.

Specifically, for the display device in the previous embodiment, a sucking head 160 accurately sucks the printed circuit board 130, and drives the printed circuit board 130 and the bracket 140 to rotate in a counterclockwise direction in FIG. 4 until the printed circuit board 130 is attached and bonded to a predetermined area of the second surface of the panel 110, thus obtaining the display device after the printed circuit board 130 is bonded. That is to say, the display device of the embodiment shown in FIG. 5 is obtained. It can be known from the display device shown in FIG. 5 that after the printed circuit board is bonded, the bracket 140 continues attaching to and pressing the printed circuit board 130 while pressing the flexible connecting member 120, which reduces a risk of peeling of a backplate and a support plate resulting from rebounding of the flexible connecting member 120 after the printed circuit board 130 is bonded. At the same time, the arc-shaped portion 142 of the bracket 140 correspondingly protects the flexible connecting member 120, thereby reducing a risk of damage to the flexible connecting member 120 by an external force.

Correspondingly, the present application further provides an electronic apparatus. The electronic apparatus comprises the display device in the embodiment of FIG. 4, and has the technical features and technical functions of the display device provided in the embodiments of the present application. For the specific embodiments and working principles, please refer to the above-mentioned specific embodiments, and a detailed description thereof is omitted herein for brevity.

In summary, the present application provides a display device and an electronic apparatus. In the display device of the present application, a bracket comprising a planar portion and an arc-shaped portion is attached to a printed circuit board before 3D bonding. After the 3D bonding, the bracket supports the printed circuit board and the flexible connecting member, which facilitates stability of the display device during a transportation process, and reduces damage of the printed circuit board or the flexible connecting member during the transportation process. The bracket supports the printed circuit board horizontally, which improves accuracy of a sucking head for sucking the printed circuit board during a bonding process of the printed circuit board, reducing shaking of the printed circuit board during the bonding process, and preventing damage of wires of the flexible connecting member during the bonding process. After the bonding of the printed circuit board, the bracket continues attaching to and pressing the printed circuit board while pressing the flexible connecting member, which reduces a risk of peeling of a backplate and a support plate due to rebounding of the flexible connecting member after the bonding process. At the same time, the arc-shaped portion of the bracket correspondingly protects the flexible connecting member, thus reducing a risk of damage to the flexible connecting member due to an external force.

The display device and electronic equipment provided in the embodiments of the present application are described in detail above. Specific examples are used in the present disclosure to illustrate the working principles and embodiments of the present application. The descriptions of the above embodiments are only for ease of understanding the method and scope of use of the present application. At the same time, those skilled in the art can change the specific embodiments and the scope of use according to the ideas of the present application. In summary, the content of the present specification should not be understood as a limit to the present application.

What is claimed is:

1. A display device, comprising:
   a panel, a flexible connecting member, a printed circuit board, a cover plate, and a bracket;
   wherein the flexible connecting member connects the panel and the printed circuit board; the cover plate comprises a flat region and a curved region; an inner surface of the cover plate is attached to a first surface of the panel; the bracket comprises a planar portion; and the planar portion is horizontally attached to the printed circuit board;
   wherein a length of the planar portion is less than a length of the printed circuit board.

2. The display device according to claim 1, wherein an orthographic projection of the planar portion projected on a plane where the printed circuit board is located falls within an area where the printed circuit board is located.

3. The display device according to claim 2, wherein the bracket further comprises an arc-shaped portion, the arc-shaped portion is connected to a side of the planar portion close to the flexible connecting member, and a concave surface of the arc-shaped portion is away from the flexible connecting member.

4. The display device according to claim 3, wherein before the printed circuit board is bonded to a second surface of the panel, the arc-shaped portion and the curved region contact and support each other, and the curved region accommodates a portion of the flexible connecting member, and the arc-shaped portion supports other portions of the flexible connecting member.

5. The display device according to claim 3, wherein after the printed circuit board is bonded to a second surface of the panel, the curved region accommodates a portion of the flexible connecting member, a convex surface of the arc-shaped portion presses the flexible connecting member, and the planar portion presses the printed circuit board.

6. The display device according to claim 3, wherein a boundary face between the planar portion and the arc-shaped portion is flush with a boundary face between the printed circuit board and the flexible connecting member.

7. The display device according to claim 3, wherein a width of the arc-shaped portion is arranged corresponding to a width of the flexible connecting member, and the width of the arc-shaped portion is greater than or equal to the width of the flexible connecting member.

8. The display device according to claim 3, wherein an arc measure of the arc-shaped portion is greater than 0 degrees and less than or equal to 90 degrees.

9. The display device according to claim 1, wherein a width of the planar portion is equal to a width of the printed circuit board.

10. An electronic apparatus, comprising a display device, the display device comprising:
- a panel, a flexible connecting member, a printed circuit board, a cover plate, and a bracket;
- wherein the flexible connecting member connects the panel and the printed circuit board; the cover plate comprises a flat region and a curved region; an inner surface of the cover plate is attached to a first surface of the panel; the bracket comprises a planar portion; and the planar portion is horizontally attached to the printed circuit board;
- wherein a length of the planar portion is less than a length of the printed circuit board.

11. The electronic apparatus according to claim 10, wherein an orthographic projection of the planar portion projected on a plane where the printed circuit board is located falls within an area where the printed circuit board is located.

12. The electronic apparatus according to claim 11, wherein the bracket further comprises an arc-shaped portion, the arc-shaped portion is connected to a side of the planar portion close to the flexible connecting member, and a concave surface of the arc-shaped portion is away from the flexible connecting member.

13. The electronic apparatus according to claim 12, wherein before the printed circuit board is bonded to a second surface of the panel, the arc-shaped portion and the curved region contact and support each other, and the curved region accommodates a portion of the flexible connecting member, and the arc-shaped portion supports other portions of the flexible connecting member.

14. The electronic apparatus according to claim 12, wherein after the printed circuit board is bonded to a second surface of the panel, the curved region accommodates a portion of the flexible connecting member, a convex surface of the arc-shaped portion presses the flexible connecting member, and the planar portion presses the printed circuit board.

15. The electronic apparatus according to claim 12, wherein a boundary face between the planar portion and the arc-shaped portion is flush with a boundary face between the printed circuit board and the flexible connecting member.

16. The electronic apparatus according to claim 12, wherein a width of the arc-shaped portion is arranged corresponding to a width of the flexible connecting member, and the width of the arc-shaped portion is greater than or equal to the width of the flexible connecting member.

17. The electronic apparatus according to claim 12, wherein an arc measure of the arc-shaped portion is greater than 0 degrees and less than or equal to 90 degrees.

18. The electronic apparatus according to claim 10, wherein a width of the planar portion is equal to a width of the printed circuit board.

* * * * *